(12) United States Patent
Heo et al.

(10) Patent No.: US 8,159,378 B2
(45) Date of Patent: Apr. 17, 2012

(54) ANALOG-TO-DIGITAL CONVERSION METHOD USING RC TIME CONSTANT CALIBRATOR AND ANALOG-TO-DIGITAL CONVERTER THEREFOR

(75) Inventors: Seung Chan Heo, Yongin-si (KR); Sang Youb Lee, Hwasung-si (KR); Ji-Soo Chang, Yongin-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 184 days.

(21) Appl. No.: 12/705,387

(22) Filed: Feb. 12, 2010

(65) Prior Publication Data
US 2010/0207800 A1    Aug. 19, 2010

(30) Foreign Application Priority Data

Feb. 17, 2009    (KR) .................. 10-2009-0012712

(51) Int. Cl.
*H03M 1/06*    (2006.01)
(52) U.S. Cl. ........ 341/120; 341/118; 341/119; 341/143; 341/155
(58) Field of Classification Search .......... 341/118–121, 341/155, 172, 143
See application file for complete search history.

(56) References Cited

U.S. PATENT DOCUMENTS

| | | | |
|---|---|---|---|
| 5,914,633 A * | 6/1999 | Comino et al. ............... 327/553 |
| 6,441,767 B1 | 8/2002 | Frazier | |
| 6,584,591 B1 * | 6/2003 | Taylor ........................... 714/731 |
| 6,803,813 B1 * | 10/2004 | Pham ............................ 327/553 |
| 6,885,181 B1 * | 4/2005 | Roo ............................. 324/76.28 |
| 7,375,659 B2 * | 5/2008 | Huang ............................ 341/61 |
| 7,574,317 B2 * | 8/2009 | Heo ............................. 702/107 |
| 7,944,378 B1 * | 5/2011 | Pesenti ......................... 341/118 |
| 7,944,385 B2 * | 5/2011 | Le Guillou .................... 341/143 |
| 2003/0090316 A1 * | 5/2003 | Dathe et al. ................... 327/554 |
| 2004/0169565 A1 * | 9/2004 | Gaggl et al. .................. 333/17.1 |
| 2004/0260500 A1 * | 12/2004 | Punzenberger et al. ...... 702/107 |
| 2005/0118980 A1 * | 6/2005 | Pai et al. ....................... 455/340 |
| 2005/0253646 A1 * | 11/2005 | Lin ............................... 327/553 |
| 2009/0108858 A1 * | 4/2009 | Kao et al. ..................... 324/754 |

FOREIGN PATENT DOCUMENTS

| | | |
|---|---|---|
| JP | 62-178018 | 8/1987 |
| JP | 2004-363759 | 12/2004 |
| KR | 10-2006-0134578 | 12/2006 |

OTHER PUBLICATIONS

English Abstract for Publication No. 62-178018.
English Abstract for Publication No. 2004-363759.
English Abstract for Publication No. 10-2006-0134578.

* cited by examiner

Primary Examiner — Linh Nguyen
(74) Attorney, Agent, or Firm — F. Chau & Associates, LLC

(57) ABSTRACT

An analog-to-digital conversion method using an RC time constant calibrator is provided. The method includes the operations of comparing a crossing time point at which a first reference signal and a second reference signal cross each other with a target time point and calibrating an RC time constant according to a result of the comparison. A length of time until the crossing time point at which a first analog signal and a second analog signal cross each other is counted based on a calibrated RC time constant. The counted value is output.

14 Claims, 4 Drawing Sheets

ANALOG-TO-DIGITAL CONVERSION METHOD USING RC TIME CONSTANT CALIBRATOR AND ANALOG-TO-DIGITAL CONVERTER THEREFOR

CROSS-REFERENCE TO RELATED APPLICATIONS

This application claims priority under 35 U.S.C. §119 to Korean Patent Application No. 10-2009-0012712, filed on Feb. 17, 2009, the disclosure of which is incorporated herein in its entirety by reference.

BACKGROUND

1. Technical Field

The present invention relates to an analog-to-digital conversion method, and more particularly, to an analog-to-digital conversion method using, and more particularly, to a method for analog-to-digital conversion using an RC time constant calibrator and an analog-to-digital converter therefor.

2. Discussion of the Related Art

Modern communication systems include microchips containing analog-to-digital converters (ADCs) and filters. The ADCs digitize low-frequency signals such as touch panel signals, backlight brightness control signals for liquid crystal displays (LCDs), and temperature sensor signals. The filters remove unwanted signal components and/or strengthen desired signal components.

The filters use a cut-off frequency to pass those components of the input signal that fall within a particular frequency range and block those components of the input signal that fall outside of the particular frequency range. The cut-off frequency of a filter can be controlled by a time constant. For example, a filter can include an RC time constant calibrator for controlling a time constant. The RC time constant calibrator can control a cut-off frequency that may be affected by an external environment by adjusting resistance and/or capacitance.

However, the RC time constant calibrator is used for a very short time compared to an overall system operating time. For example, the RC time constant calibrator may operate just for a moment when power is turned on in a system or at a predetermined time. In addition, with the compactness of modern chips, the ADC and the RC time constant calibrator are implemented together in a single microchip. As a result, excess layout space is used in accommodating these components.

SUMMARY

Some exemplary embodiments of the present invention provide an analog-to-digital conversion method using an RC time constant calibrator.

Some exemplary embodiments of the present invention also provide an analog-to-digital converter for performing the analog-to-digital conversion method.

According to some exemplary embodiments of the present invention, there is provided an analog-to-digital conversion method using an RC time constant calibrator. The method includes the operations of comparing a crossing time point at which a first reference signal and a second reference signal cross each other with a target time point. An RC time constant is calibrated according to a result of the comparison. Counting is performed until a crossing time point at which a first analog signal and a second analog signal cross each other based on a calibrated RC time constant and a count value is outputted.

According to exemplary embodiments of the present invention, there is provided an analog-to-digital converter including a switching unit configured to perform a switching operation according to a control signal and to output a pair of signals forming differential outputs among a plurality of input signals. An RC time constant calibrator is configured to output a count value obtained by counting time elapsed until a crossing time point at which the pair of signals output from the switching unit cross each other based on an RC time constant.

BRIEF DESCRIPTION OF THE DRAWINGS

The above and other features and aspects of the exemplary embodiments of the present invention are described in detail below with reference to the attached drawings in which.

DETAILED DESCRIPTION OF EXEMPLARY EMBODIMENTS

Figure 1:
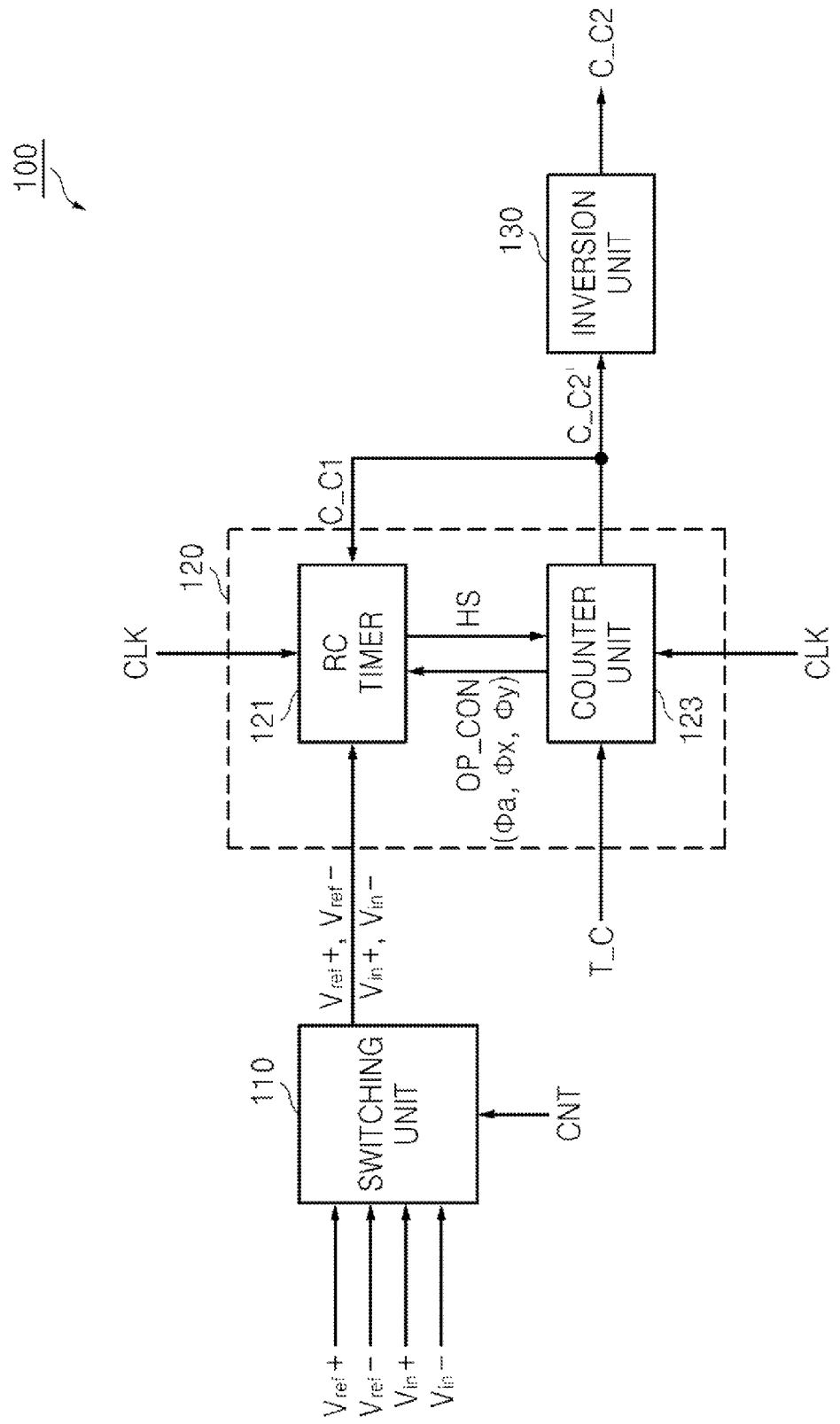
FIG. 1 is a schematic block diagram of an analog-to-digital converter (ADC) according to exemplary embodiments of the present invention.

Exemplary embodiments of the present invention now will be described more fully hereinafter with reference to the accompanying drawings. This invention may, however, be embodied in many different forms and should not be construed as limited to the embodiments set forth herein. In the drawings, the size and relative sizes of layers and regions may be exaggerated for clarity. Like numbers may refer to like elements throughout.

It will be understood that when an element is referred to as being "connected" or "coupled" to another element, it can be directly connected or coupled to the other element or intervening elements may be present.

FIG. 1 is a schematic block diagram of an analog-to-digital converter (ADC) 100 according to exemplary embodiments of the present invention. Referring to FIG. 1, the ADC 100 includes a switching unit 110, an RC time constant calibrator 120, and an inversion unit 130.

The switching unit 110 performs a switching operation in response to an externally supplied control signal CNT, e.g., from an external controller (not shown). The switching unit 110 outputs differential signals among a plurality of input signals according to the switching operation. For example, the switching unit 110 receives a first reference signal $V_{ref}^+$, a second reference signal $V_{ref}^-$, a first analog signal $V_{in}^+$, and a second analog signal $V_{in}^-$ from an external source. The first and second reference signals $V_{ref}^+$ and $V_{ref}^-$ are differential signals and the first and second analog signals $V_{in}^+$ and $V_{in}^-$ are differential signals. The first and second reference signals $V_{ref}^+$ and $V_{ref}^-$ and the first and second analog signals $V_{in}^+$ and $V_{in}^-$ may be voltage signals. The switching unit 110 outputs differential output voltages, for example, the first and second reference signals $V_{ref}^+$ and $V_{ref}^-$ or the first and second analog signals $V_{in}^+$ and $V_{in}^-$, through a switching operation according to the control signal CNT.

The RC time constant calibrator 120 includes an RC timer 121 and a counter unit 123. The RC time constant calibrator 120 performs RC time constant calibration based on the first and second reference signals $V_{ref}^+$ and $V_{ref}^-$ provided from the switching unit 110 or the RC time constant calibrator 120 performs analog-to-digital conversion for generating a digital value based on the first and second analog signals $V_{in}^+$ and $V_{in}^-$ provided from the switching unit 110.

For example, the RC timer 121 performs the RC time constant calibration by adjusting a time when the first and second reference signals $V_{ref}^+$ and $V_{ref}^-$ cross each other according to an RC time constant calibration code C_C1 output from the counter unit 123. In addition, the RC timer 121 extracts a time when the first and second analog signals $V_{in}^+$ and $V_{in}^-$ cross each other according to a calibrated RC time constant and performs the analog-to-digital conversion. The RC timer 121 outputs a hold signal HS at the time when a pair of signals, for example, the first and second reference signals $V_{ref}^+$ and $V_{ref}^-$ or the first and second analog signals $V_{in}^+$ and $V_{in}^-$ cross each other.

Figure 2:
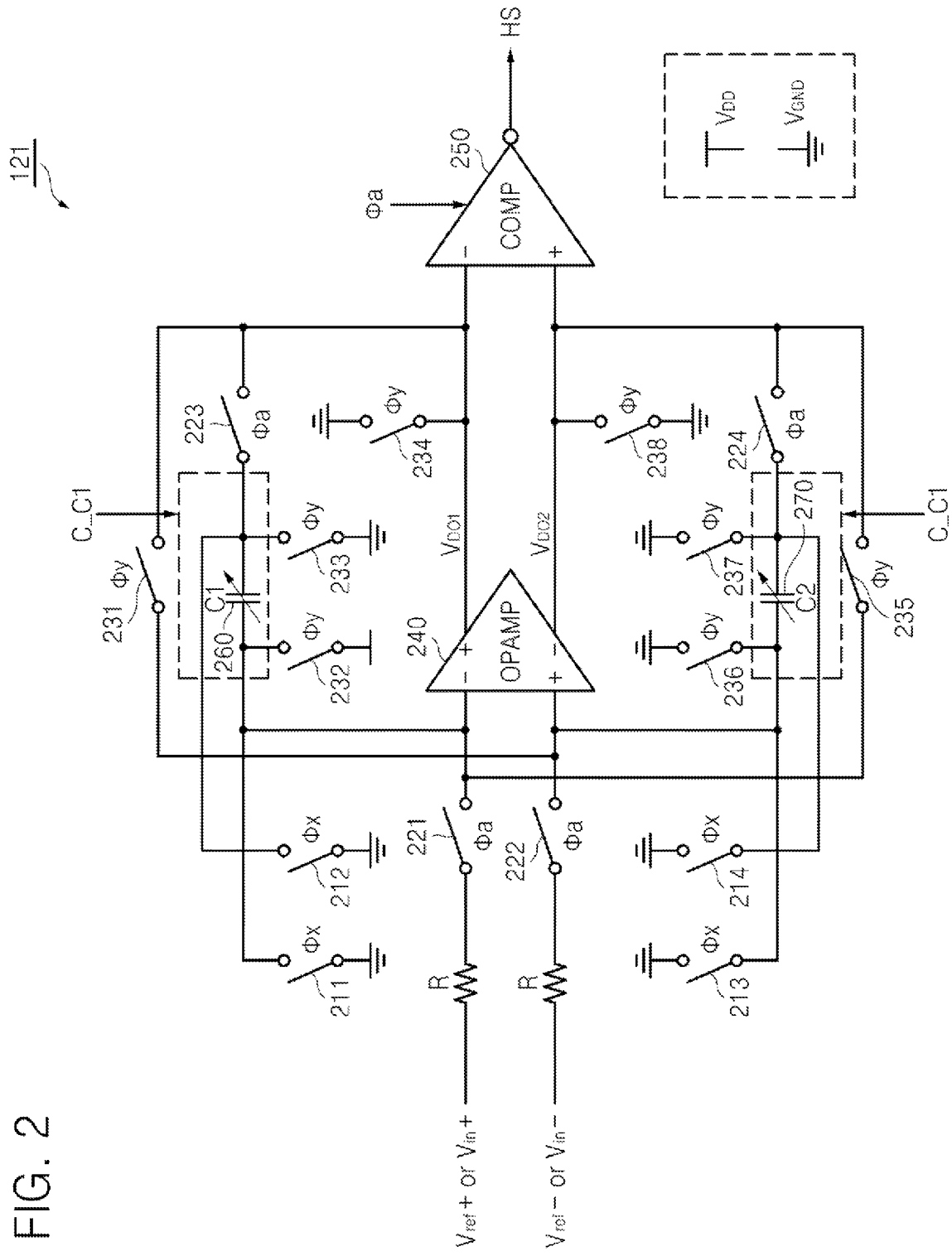
FIG. 2 is a schematic circuit diagram of an RC timer illustrated in FIG. 1.

FIG. 2 is a schematic circuit diagram of the RC timer 121 illustrated in FIG. 1. Referring to FIG. 2, the RC timer 121 includes a differential amplifier 240, a first slope capacitor 260, a second slope capacitor 270, a hold signal generator 250, and a plurality of switches. The plurality of switches include reset switches 211 through 214, initialization switches 231 through 238, and operation switches 223 and 224, respectively. The differential amplifier 240 includes an inverting (−) input terminal, a non-inverting (+) input terminal, an inverting (−) output terminal, and a non-inverting (+) output terminal.

Capacitance of the first slope capacitor 260 and capacitance of the second slope capacitor 270 can be adjusted according to the RC time constant calibration code C_C1 output from the counter unit 123. A first end of the first slope capacitor 260 and a first end of the second slope capacitor 270 are connected to the inverting input terminal (−) and the non-inverting input terminal (+), respectively, of the differential amplifier 240. A second end of the first slope capacitor 260 and a second end of the second slope capacitor 270 are connected to the non-inverting output terminal (+) and the inverting output terminal (−), respectively, of the differential amplifier 240.

The reset switches 211 through 214 operate in response to a control code, e.g., a reset code φx. The initialization switches 231 through 238 operate in response to another control code, e.g., an initialization code φy. The operation switches 223 and 224 operate in response to another control code, e.g., an operation code φa.

The hold signal generator 250 outputs the hold signal HS at the time when a pair of signals, for example, the first and second reference signals $V_{ref}^+$ and $V_{ref}^-$ or the first and second analog signals $V_{in}^+$ and $V_{in}^-$ input to the differential amplifier 240 cross each other according to the operations of the operation switches 223 and 224. The operation of the RC timer 121 is described in detail below.

Referring back to FIG. 1, the counter unit 123 generates a plurality of control codes, e.g., the reset code φx, the initialization code φy, and the operation code φa for controlling the RC timer 121 based on an external clock signal, e.g., a reference clock signal CLK. In addition, the counter unit 123 outputs the RC time constant calibration code C_C1 for the RC time constant calibration or an analog-to-digital converted value C_C2' based on a count value obtained by counting until the hold signal HS is output by the RC timer 121, for example, until the time when the pair of signals cross each other. The operation of the counter unit 123 is described in detail below.

The inversion unit 130 inverts the analog-to-digital converted value C_C2' output from the counter unit 123 and thus outputs an inverted analog-to-digital converted value C_C2.

Figure 3:
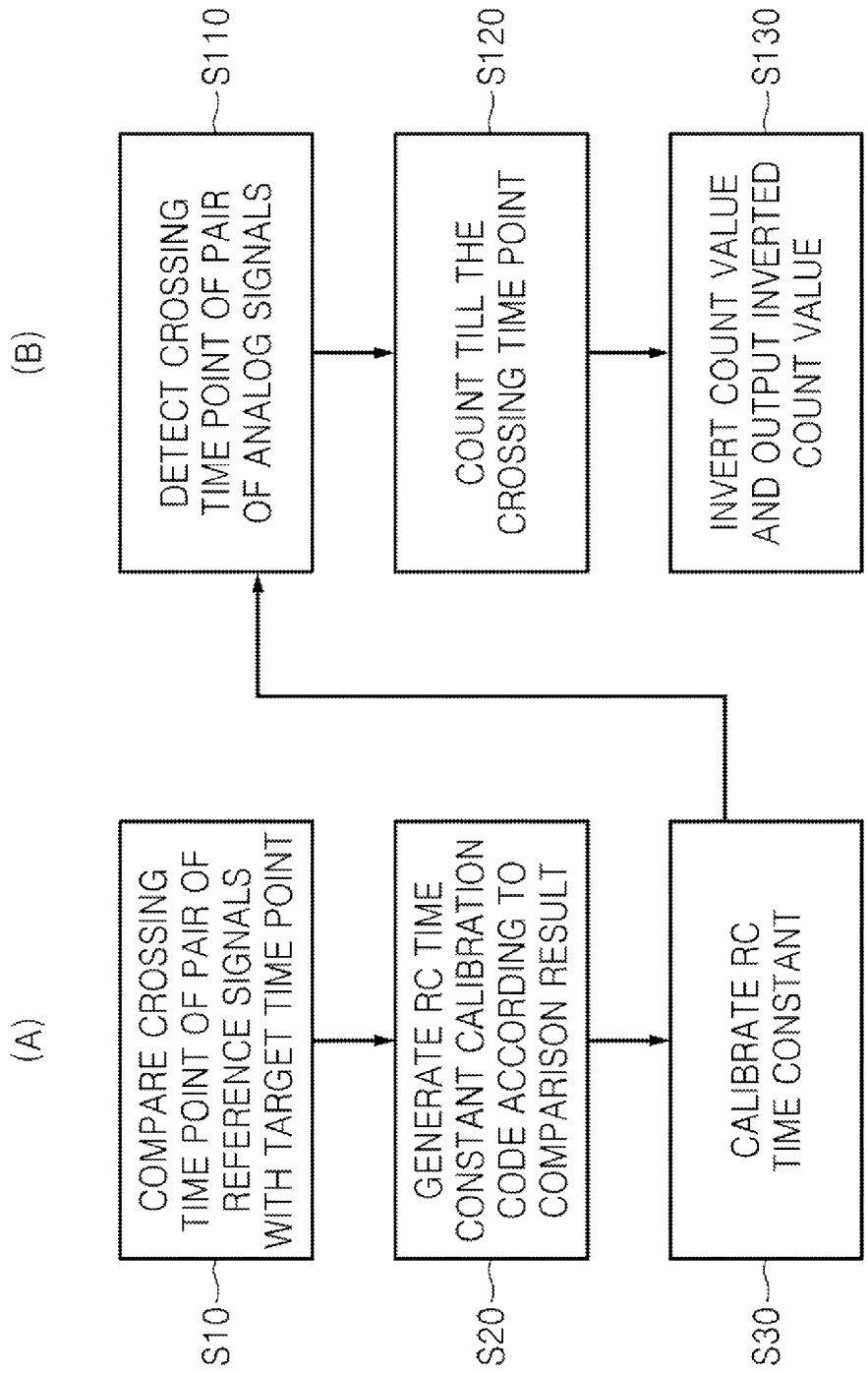
FIG. 3 is a flowchart illustrating the operations of the ADC of FIG. 1 according to exemplary embodiments of the present invention.
Figure 4:
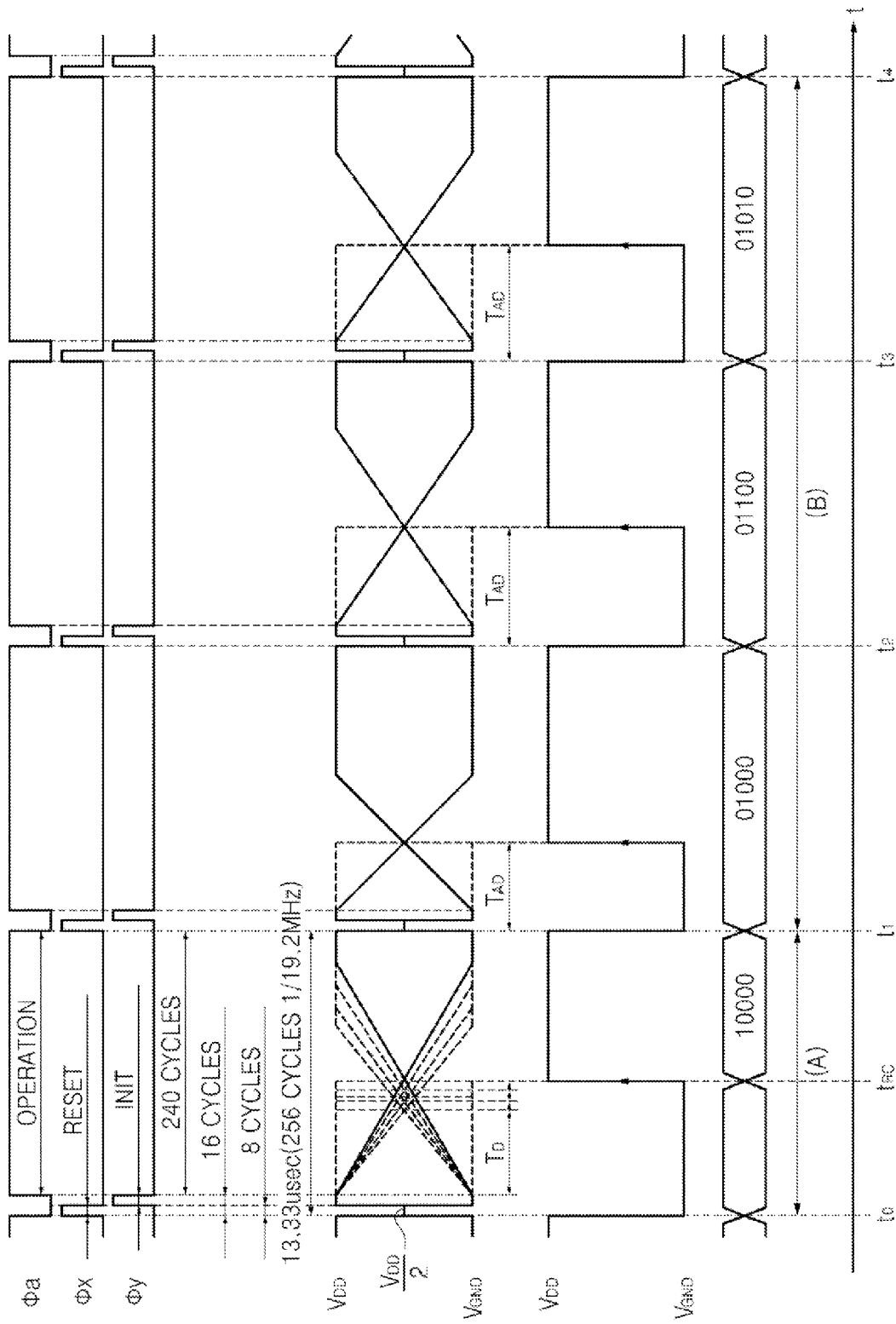
FIG. 4 is a timing chart of the operations illustrated in FIG. 3.

FIG. 3 is a flowchart illustrating the operations of the ADC 100 illustrated in FIG. 1. FIG. 4 is a timing chart illustrating the operations shown in FIG. 3. RC time constant calibration (A) and analog-to-digital conversion (B) of the ADC 100 are described in detail below reference to FIGS. 1 through 4.

Firstly, RC time constant calibration (A) will be described. The switching unit 110 performs a switching operation according to a level of the externally provided control signal CNT and outputs the first and second reference signals $V_{ref}^+$ and $V_{ref}^-$ which are differential output voltages. For example, the switching unit 110 performs a switching operation according to the control signal CNT at a first level, e.g., a high level, and thus outputs the first and second reference signals $V_{ref}^+$ and $V_{ref}^-$.

The counter unit 123 generates the reset code φx, the initialization code φy, and the operation code φa based on the reference clock signal CLK. The codes φx, φy, and φa are provided to the RC timer 121.

The RC timer 121 controls the operations of the reset switches 211 through 214 according to the reset code φx from the counter unit 123 and initializes the inverting input terminal and the non-inverting input terminal of the differential amplifier 240 to a first reference voltage, e.g., $V_{GND}$. At this time, the first and second slope capacitors 260 and 270 in the RC timer 121 are discharged. For example, as illustrated in FIG. 4, when both of the inverting input terminal and the non-inverting input terminal of the differential amplifier 240 receive the first reference voltage $V_{GND}$, the non-inverting output terminal and the inverting output terminal of the differential amplifier 240 output voltages having the same level, e.g., $V_{DD}/2$.

Upon receiving the initialization code φy from the counter unit 123, the RC timer 121 controls the operations of the initialization switches 231 through 238, maintains the non-inverting output terminal and the inverting input terminal of the differential amplifier 240 at the first reference voltage $V_{GND}$, and initializes the inverting output terminal and the non-inverting input terminal of the differential amplifier 240 to a second reference voltage, e.g., $V_{DD}$, that is higher than the first reference voltage $V_{GND}$. Thereafter, the RC timer 121 charges the first slope capacitor 260 and discharges the second slope capacitor 270. For example, as illustrated in FIG. 4, the non-inverting output terminal of the differential amplifier 240 is maintained at the first reference voltage $V_{GND}$ and the inverting output terminal of the differential amplifier 240 is initialized to the second reference voltage $V_{DD}$.

Upon receiving the operation code φa and the reference clock signal CLK, the RC timer 121 receives the first and second reference signals $V_{ref}^+$ and $V_{ref}^-$ from the switching unit 110 and integrates them. For example, during a period from a time $t_0$ to a time $t_1$ on the time axis "t" illustrated in FIG. 4, a voltage $V_{DO1}$ of the non-inverting output terminal of the differential amplifier 240 increases and a voltage $V_{DO2}$ of the inverting output terminal thereof decreases.

The output voltages $V_{DO1}$ and $V_{DO2}$ of the differential amplifier 240 satisfy Equation (1):

$$V_{DO1}(t) = V_{GND} + \frac{\Delta V}{RC}t \qquad (1)$$

$$V_{DO2}(t) = V_{VDD} - \frac{\Delta V}{RC}t,$$

where $V_{DO1}$ is the voltage of the non-inverting output terminal of the differential amplifier 240, $V_{DO2}$ is the voltage of the inverting output terminal of the differential amplifier 240, and $\Delta V$ is a voltage difference satisfying $$\Delta V = \frac{V_{ref}^+ - V_{ref}^-}{2}.$$

Accordingly, a time when the voltage $V_{DO1}$ of the non-inverting output terminal of the differential amplifier 240 crosses the voltage $V_{DO2}$ of the inverting output terminal thereof satisfies Equation (2):

$$V_{DO1}(T_D) = V_{DO2}(T_D) = V_{GND} + \frac{\Delta V}{RC}T_D = V_{VDD} - \frac{\Delta V}{RC}T_D \quad (2)$$

$$\frac{2\Delta V}{RC}T_D = V_{VDD}(V_{GND} = 0)$$

$$T_D = \frac{V_{VDD}}{2\Delta V}RC = \frac{V_{VDD}}{V_{ref}^+ - V_{ref}^-}RC,$$

where $T_D$ is a time delay value till the time when the first and second reference signals $V_{ref}^+$ and $V_{ref}^-$ cross each other. As is shown in Equation (2), the time delay value $T_D$ till the time when the voltage $V_{DO1}$ of the non-inverting output terminal of the differential amplifier 240 crosses the voltage $V_{DO2}$ of the inverting output terminal thereof may be proportional to the capacitance of the first slope capacitor 260 and the capacitance of the second slope capacitor 270.

For example, an increasing slope of the voltage $V_{DO1}$ output from the non-inverting output terminal of the differential amplifier 240 may be in inverse proportion to the capacitance of the first slope capacitor 260 and a decreasing slope of the voltage $V_{DO2}$ output from the inverting output terminal of the differential amplifier 240 may be in inverse proportion to the capacitance of the second slope capacitor 270. For example, the time when the voltages $V_{DO1}$ and $V_{DO2}$ cross each other may be determined based on the product of a calibration constant indicating a ratio between the first and second reference signals $V_{ref}^+$ and $V_{ref}^-$ and a variable RC time constant controlled according to the RC time constant calibration code C_C1 output from the counter unit 123 so that the time does not depend upon the change in processes.

The hold signal generator 250 compares a first output signal of the differential amplifier 240, for example, the voltage $V_{DO1}$ output from the non-inverting output terminal of the differential amplifier 240 with a second output signal of the differential amplifier 240, for example, the voltage $V_{DO2}$ output from the inverting output terminal of the differential amplifier 240 in response to the operation code φa provided from the counter unit 123 and outputs the hold signal HS at a time when the two voltages $V_{DO1}$ and $V_{DO2}$ have the same level. For example, the hold signal HS may be output at a time when levels of the first and second output signals of the differential amplifier 240 cross each other (hereinafter, referred to as a crossing time point).

The counter unit 123 compares the crossing time point with a target time point in step S10 and generates the RC time constant calibration code C_C1 according to a result of the comparison in step S20. For example, the counter unit 123 may receive a target count value T_C corresponding to the target time point from an external source. Thereafter, the counter unit 123 may perform counting from a time when the initialization code φy is output to the RC timer 121 to a time when the RC timer 121 outputs the hold signal HS, for example, during the time delay $T_D$ and compare an actual count value resulting from the counting with the target count value T_C in step S10.

The counter unit 123 outputs the RC time constant calibration code C_C1 according to the comparison result. For example, the counter unit 123 may output the RC time constant calibration code C_C1 that controls the time at which the RC timer 121 outputs the hold signal HS when the actual count value obtained in the time delay $T_D$ is greater or less than the target count value T_C. When the actual count value obtained in the time delay $T_D$ is the same as the target count value T_C, the counter unit 123 may output the count value as the RC time constant calibration code C_C1.

The RC time constant calibration code C_C1 output from the counter unit 123 is input to the RC timer 121 and changes the capacitance of the first slope capacitor 260 and the capacitance of the second slope capacitor 270 in the RC timer 121 so that an RC time constant is calibrated in step S30. For example, the RC timer 121 may control the crossing time point, at which the levels of two voltage signals output from the differential amplifier 240 cross each other, to be the same as the target time point using the first and second slope capacitors 260 and 270 whose capacitance changes according to the RC time constant calibration code C_C1 provided from the counter unit 123.

The RC time constant calibration code C_C1 may be set by the counter unit 123 in order starting with a most significant bit (MSB) to a least significant bit (LSB). Thereafter, when it is determined that the target time point is greater than the crossing time point as a result of comparing the actual count value obtained at the crossing time point with the target count value T_C corresponding to the target time point, the bits set in the RC time constant calibration code C_C1 may be maintained. When it is determined that the target time point is less than the crossing time point, the bits set in the RC time constant calibration code C_C1 may be reset.

Referring to FIG. 4, during the period from the time $t_0$ to the time $t_1$, the counter unit 123 outputs the RC time constant calibration code C_C1 for controlling the crossing time point of two voltage signals output from the differential amplifier 240 of the RC timer 121 to be the same as the target time point. The RC timer 121 calibrates the RC time constant by changing the capacitance of each of the first and second slope capacitors 260 and 270 according to the RC time constant calibration code C_C1 output from the counter unit 123 and thus controls the crossing time point to be the same as the target time point.

The above-described operations of outputting the RC time constant calibration code C_C1 using the counter unit 123 and calibrating the RC time constant using the RC timer 121 are repeated and, when the crossing time point becomes the same as the target time point, for example, at a time $t_{RC}$ on the time axis "t" in FIG. 4, the counter unit 123 outputs a RC time constant calibration code C_C1 of "10000". When the RC time constant calibration (A) is completed through those operations, the RC timer 121 may have the capacitance of the first slope capacitor 260 and the capacitance of the second slope capacitor 270, which have been fixed by the final RC time constant calibration code C_C1 of "10000".

Thereafter, the ADC 100 performs the analog-to-digital conversion (B).

The switching unit 110 performs a switching operation according to the control signal CNT at a second level, e.g., a low level, and thus outputs the first and second analog signals $V_{in}^+$ and $V_{in}^-$ which are differential output voltages. The counter unit 123 generates the reset code φx, the initialization code φy, and the operation code φa based on the reference clock signal CLK. The codes φx, φy, and φa are provided to the RC timer 121.

The RC timer 121 detects a crossing time point of the first and second analog signals $V_{in}^+$ and $V_{in}^-$ provided from the switching unit 110 in step S110. For example, the RC timer 121 may initialize the inverting input terminal and the non-inverting input terminal of the differential amplifier 240 to the first reference voltage $V_{GND}$ and discharge the first and second slope capacitors 260 and 270 according to the reset code φx from the counter unit 123. In addition, according to the initialization code φy, the RC timer 121 may maintain the non-inverting output terminal and the inverting input terminal of the differential amplifier 240 at the first reference voltage $V_{GND}$ and initialize the inverting output terminal and the non-inverting input terminal of the differential amplifier 240 to the second reference voltage $V_{DD}$ higher than the first reference voltage $V_{GND}$. Thereafter, the RC timer 121 charges the first slope capacitor 260 and discharges the second slope capacitor 270.

Upon receiving the operation code φa and the reference clock signal CLK, the RC timer 121 receives the first and second analog signals $V_{in}^+$ and $V_{in}^-$ from the switching unit 110 and integrates them. For example, during a period from the time $t_1$ to a time $t_2$ on the time axis "t" illustrated in FIG. 4, the voltage $V_{DO1}$ of the non-inverting output terminal of the differential amplifier 240 increases and the voltage $V_{DO2}$ of the inverting output terminal thereof decreases.

The output voltages $V_{DO1}$ and $V_{DO2}$ of the differential amplifier 240 satisfy Equation (1). According to the RC time constant calibrated by the RC time constant calibration code C_C1 provided from the counter unit 123 through the RC time constant calibration (A), a time when the voltage $V_{DO1}$ of the non-inverting output terminal of the differential amplifier 240 crosses the voltage $V_{DO2}$ of the inverting output terminal thereof satisfies Equation (3):

$$V_{DO1}(T_D) = V_{DO2}(T_D) = V_{GND} + \frac{\Delta V}{RC}T_D = V_{VDD} - \frac{\Delta V}{RC}T_D \quad (3)$$

$$\frac{2\Delta V}{RC}T_D = V_{VDD}(V_{GND} = 0)$$

$$T_{AD} = \frac{V_{VDD}}{2\Delta V}RC = \frac{V_{VDD}}{V_{in}^+ - V_{in}^-}RC,$$

where $T_{AD}$ is a time delay value till the time when the first and second analog signals $V_{in}^+$ and $V_{in}^-$ cross each other. Since the RC timer 121 has the fixed capacitance, for example, the fixed capacitance of the first slope capacitor 260 and the fixed capacitance of the second slope capacitor 270 according to the RC time constant calibration (A), the crossing time point of the first and second analog signals $V_{in}^+$ and $V_{in}^-$ may be determined by a difference therebetween.

The hold signal generator 250 of the RC timer 121 compares a first output signal of the differential amplifier 240, for example, the voltage $V_{DO1}$ output from the non-inverting output terminal of the differential amplifier 240 with a second output signal of the differential amplifier 240, for example, the voltage $V_{DO2}$ output from the inverting output terminal of the differential amplifier 240 in response to the operation code φa provided from the counter unit 123 and outputs the hold signal HS at a time when the two voltage signals have the same level. For example, the hold signal HS may be output at a time when levels of the first and second output signals of the differential amplifier 240 cross each other.

The counter unit 123 performs counting from a time when the initialization code φy is output to the RC timer 121 to a time when the RC timer 121 outputs the hold signal HS, for example, during the time delay $T_{AD}$, and outputs the count value C_C2' in step S120. The first and second analog signals $V_{in}^+$ and $V_{in}^-$ input to the RC timer 121 may cross each other due to the first and second slope capacitors 260 and 270 each having the fixed capacitance and the count value C_C2' corresponding to the time delay $T_{AD}$ till the crossing time point of the first and second analog signals $V_{in}^+$ and $V_{in}^-$ may be an analog-to-digital converted value of the two signals $V_{in}^+$ and $V_{in}^-$.

For example, as illustrated in FIG. 4, during the period from the time $t_1$ to the time $t_2$, the RC time constant calibrator 120 outputs a count value, e.g., "01000", obtained by counting till the crossing time point of the first and second analog signals $V_{in}^+$ and $V_{in}^-$, for example, during the time delay $T_{AD}$. During a period from the time $t_2$ to a time $t_3$, the RC time constant calibrator 120 outputs a count value, e.g., "01100", obtained by counting till the crossing time point of the first and second analog signals $V_{in}^+$ and $V_{in}^-$, for example, during the time delay $T_{AD}$. During a period from the time $t_3$ to a time $t_4$, the RC time constant calibrator 120 outputs a count value, e.g., "01010", obtained by counting till the crossing time point of the first and second analog signals $V_{in}^+$ and $V_{in}^-$, for example, during the time delay $T_{AD}$.

The count value C_C2' output from the RC time constant calibrator 120 is provided to the inversion unit 130. The inversion unit 130 inverts the count value C_C2' and outputs the analog-to-digital converted value C_C2 in step S130. This is because the time delay $T_{AD}$, for example, the crossing time point of the first and second analog signals $V_{in}^+$ and $V_{in}^-$, is in inverse proportion to the difference between the first and second analog signals $V_{in}^+$ and $V_{in}^-$. The count value C_C2' output from the RC time constant calibrator 120 decreases as the difference between the first and second analog signals $V_{in}^+$ and $V_{in}^-$ increases, and therefore, the count value C_C2' is inverted before being output.

For example, the count value C_C2' of "01000" output from the RC time constant calibrator 120 during the period from the time $t_1$ to the time $t_2$ may be output as the analog-to-digital converted value C_C2 of "10111" by the inversion unit 130. The count value C_C2' of "01100" output from the RC time constant calibrator 120 during the period from the time $t_2$ to the time $t_3$ may be output as the analog-to-digital converted value C_C2 of "10011" by the inversion unit 130. The count value C_C2' of "01010" output from the RC time constant calibrator 120 during the period from the time $t_3$ to the time $t_4$ may be output as the analog-to-digital converted value C_C2 of "10101" by the inversion unit 130.

According to some exemplary embodiments of the present invention, an externally provided analog signal is converted into a digital signal using an RC time constant calibrator. The RC time constraint calibrator may thereby function as a low frequency analog-to-digital converter, thereby reducing a layout area of a small modem chip having a limited layout and thus increasing efficiency.

While exemplary embodiments of the present invention have been particularly shown and described with reference to the figures, it will be understood by those of ordinary skill in the art that various changes in forms and details may be made therein without departing from the spirit and scope of the present invention.

What is claimed is:

1. A method for converting an analog signal to a digital signal using an RC time constant calibrator, the method comprising:

comparing a reference signal crossing time point at which a first reference signal and a second reference signal cross each other with a target time point and calibrating an RC time constant according to a result of the comparison;

counting a length of time until an analog signal crossing time point at which a first analog signal and a second analog signal cross each other based on the calibrated RC time constant and outputting counted length of time as an analog signal crossing time point count value; and inverting the analog signal crossing time point count value.

2. The method of claim 1, wherein the step of counting and outputting the analog signal crossing time point count value comprises:

detecting a time delay value representing a length of time until the analog signal crossing time point of the first and second analog signals based on the calibrated RC time constant; and counting time corresponding to the time delay value and outputting the analog signal crossing time point count value.

3. The method of claim 1, wherein the first and second analog signals are each differential output voltages.

4. The method of claim 1, wherein the step of comparing the reference crossing time point with the target time point and calibrating the RC time constant comprises:

comparing a reference signal crossing time point count value obtained by counting a length of time until the crossing time point of the first and second reference signals with a externally input target count value corresponding to the target time point;

generating an RC time constant calibration code for controlling the reference signal crossing time point such that the reference signal crossing time point becomes close to the target time point when a length of time between the reference signal crossing time point count value and the crossing time point is not the same as the target count value; and calibrating the RC time constant based on the RC time constant calibration code such that the count value counting the length of time until the reference signal crossing time point is the same as the target count value and adjusting the reference signal crossing time point based on the calibrated RC time constant.

5. A method for converting an analog signal to a digital signal using an RC time constant calibrator, the method comprising:

comparing a reference signal crossing time point at which a first reference signal and a second reference signal cross each other with a target time point and calibrating an RC time constant according to a result of the comparison; and counting a length of time until an analog signal crossing time point at which a first analog signal and a second analog signal cross each other based on the calibrated RC time constant and outputting counted length of time as an analog signal crossing time point count value, wherein the step of counting and outputting the analog signal crossing time point count value comprises:

detecting a time delay value representing a length of time until the analog signal crossing time point of the first and second analog signals based on the calibrated RC time constant; and counting time corresponding to the time delay value and outputting the analog signal crossing time point count value, and wherein the time delay value is inversely proportional to a difference between the first and second analog signals.

6. A method for converting an analog signal to a digital signal using an RC time constant calibrator, the method comprising:

comparing a reference signal crossing time point at which a first reference signal and a second reference signal cross each other with a target time point and calibrating an RC time constant according to a result of the comparison; and counting a length of time until an analog signal crossing time point at which a first analog signal and a second analog signal cross each other based on the calibrated RC time constant and outputting counted length of time as an analog signal crossing time point count value, wherein the step of comparing the reference crossing time point with the target time point and calibrating the RC time constant comprises:

comparing a reference signal crossing time point count value obtained by counting a length of time until the crossing time point of the first and second reference signals with a externally input target count value corresponding to the target time point;

generating an RC time constant calibration code for controlling the reference signal crossing time point such that the reference signal crossing time point becomes close to the target time point when a length of time between the reference signal crossing time point count value and the crossing time point is not the same as the target count value; and calibrating the RC time constant based on the RC time constant calibration code such that the count value counting the length of time until the reference signal crossing time point is the same as the target count value and adjusting the reference signal crossing time point based on the calibrated RC time constant, and wherein the RC time constant calibration code is set in order from a most significant bit to a least significant bit, and bits set in the RC time constant calibration code are maintained when the target count value is greater than the count value counting the length of time until the reference signal crossing time point and are the RC time constant calibration code is reset when the target count value is less than the count value counting the length of time until the reference signal crossing time point.

7. An analog-to-digital converter comprising:

a switching unit configured to perform a switching operation according to a control signal and to output a pair of analog signals forming differential outputs;

an RC time constant calibrator configured to output an analog signal crossing time point count value obtained by counting a length of time until an analog signal crossing time point at which the pair of analog signals output from the switching unit cross each other based on a calibrated RC time constant; and an inversion unit configured to invert the analog signal crossing time point count value.

8. The analog-to-digital converter of claim 7, wherein the RC time constant calibrator comprises:

an RC timer configured to output a hold signal according to a time delay value as a result of the crossing time point of the pair of signals based on the RC time constant; and a counter unit configured to count the time delay value until the hold signal is output and to output the count value.

9. A method for converting an analog signal to a digital signal, comprising:

comparing a reference signal crossing time point at which a first reference signal and a second reference signal cross each other with a target time point using a comparison device;

calibrating an RC time constant based on the results of the comparison using an RC time constant calibration device;

counting a length of time elapsed prior to the occurrence of the crossing time point based on the calibrated RC time constant using a counting device;

inverting the counted length time; and outputting the inverted counted length of time using an output device.

10. The method of claim 9, wherein the step of counting comprises:

detecting a time delay value representing a length of time elapsed prior to the occurrence of the crossing time point based on the calibrated RC constant; and counting a length of time corresponding to the detection of the time delay value.

11. The method of claim 9, wherein the step of comparing includes comparing a count value obtained by counting a length of time until the crossing time point of the first and second reference signals with a externally input target count value corresponding to the target time point.

12. The method of claim 9, wherein the step of calibrating an RC time constant includes:

generating an RC time constant calibration code for controlling the crossing time point such that the crossing time point is close to the target time point when the count value counting the length of time until the reference signal crossing time point is not the same as the target count value; and calibrating the generated RC time constant based on the RC time constant calibration code such that the count value counting the length of time until the crossing time point is the same as the target count value and adjusting the crossing time point based on the calibrated RC time constant.

13. A method for converting an analog signal to a digital signal, comprising:

comparing a reference signal crossing time point at which a first reference signal and a second reference signal cross each other with a target time point using a comparison device;

calibrating an RC time constant based on the results of the comparison using an RC time constant calibration device;

counting a length of time elapsed prior to the occurrence of the crossing time point based on the calibrated RC time constant using a counting device; and outputting the counted length of time using an output device, wherein the step of counting comprises:

detecting a time delay value representing a length of time elapsed prior to the occurrence of the crossing time point based on the calibrated RC constant; and counting a length of time corresponding to the detection of the time delay value, and wherein the time delay value is inversely proportional to a difference between the first and second reference signals.

14. A method for converting an analog signal to a digital signal, comprising:

comparing a reference signal crossing time point at which a first reference signal and a second reference signal cross each other with a target time point using a comparison device;

calibrating an RC time constant based on the results of the comparison using an RC time constant calibration device;

counting a length of time elapsed prior to the occurrence of the crossing time point based on the calibrated RC time constant using a counting device; and outputting the counted length of time using an output device, wherein the step of calibrating an RC time constant includes:

generating an RC time constant calibration code for controlling the crossing time point such that the crossing time point is close to the target time point when the count value counting the length of time until the reference signal crossing time point is not the same as the target count value; and calibrating the generated RC time constant based on the RC time constant calibration code such that the count value counting the length of time until the crossing time point is the same as the target count value and adjusting the crossing time point based on the calibrated RC time constant, and wherein the RC time constant calibration code is set in order from a most significant bit to a least significant bit, and bits set in the RC time constant calibration code are maintained when the target count value is greater than the count value counting the length of time until the crossing time point and are the RC time constant calibration code is reset when the target count value is less than the count value counting the length of time until the crossing time point.

* * * * *